United States Patent [19]
Yokosuka et al.

[11] Patent Number: 5,089,819
[45] Date of Patent: Feb. 18, 1992

[54] PARALLEL-TO-SERIAL SIGNAL CONVERTING APPARATUS AND IMAGE DISPLAYING SYSTEM USING THE SAME

[75] Inventors: Hirobumi Yokosuka; Yasuo Sakai, both of Hitachi, Japan

[73] Assignee: Hitachi, Ltd., Tokyo, Japan

[21] Appl. No.: 416,831

[22] Filed: Oct. 3, 1989

[30] Foreign Application Priority Data

Oct. 5, 1988 [JP] Japan .................................. 63-249862

[51] Int. Cl.⁵ .............................................. H03M 9/00
[52] U.S. Cl. .......................................... 341/101; 341/61
[58] Field of Search ........................... 341/101, 100, 61

[56] References Cited

U.S. PATENT DOCUMENTS

| | | | |
|---|---|---|---|
| 3,274,341 | 9/1966 | Allen | 341/61 X |
| 3,753,113 | 8/1973 | Maruta et al. | 341/101 X |
| 4,216,460 | 8/1980 | Baldwin et al. | 341/101 X |
| 4,429,300 | 1/1984 | Yamasawa et al. | 341/101 X |
| 4,799,040 | 1/1989 | Yanagi | 341/101 |
| 4,878,058 | 10/1989 | Needles | 341/101 |
| 4,954,826 | 9/1990 | Isozaki et al. | 341/101 X |

Primary Examiner—A. D. Pellinen
Assistant Examiner—Sharon D. Logan
Attorney, Agent, or Firm—Antonelli, Terry, Stout & Kraus

[57] ABSTRACT

A parallel-to-serial signal converting apparatus which comprises: a logic circuit for converting first parallel bit signals of a low frequency to be converted to a high frequency serial bit signal into second parallel bit signals having the same frequency as the first parallel bit signals and having information as to whether adjacent two bits of the serial bit signal are equal in level or not; a circuit for adjusting the phase of the second parallel bit signals to form third parallel bit signals whose phases are shifted by a phase difference, successively, in an order of corresponding bits of the serial bit signal, the phase difference being substantially equal to the phase difference between adjacent two bits of the serial bit signal; and a logic circuit for logically processing the third parallel bit signals to obtain the serial bit signal. An image displaying system utilizes the parallel-to-serial signal converting apparatus.

12 Claims, 9 Drawing Sheets

PARALLEL-TO-SERIAL SIGNAL CONVERTING APPARATUS AND IMAGE DISPLAYING SYSTEM USING THE SAME

BACKGROUND OF THE INVENTION

1. Field of the Invention

The present invention generally relates to a parallel-to-serial signal converting apparatus, and particularly relates to a parallel-to-serial signal converting apparatus, when used with an image displaying system in which a serial bit signal representing an image to be displayed on a display unit of the image displaying system is transmitted in the form of low frequency parallel bit signals, adapted to convert the parallel bit signals into a serial bit signal representing the image to be displayed.

2. Description of the Prior Art

When video data of a high frequency serial bit signal representing an image to be displayed on a display unit in an image displaying system are transmitted, in order to prevent various troubles such as radiation noises or the like due to high frequency waves from occurring, the video data of the serial bit signal are converted into video data of parallel n-bit signals of a low frequency and the thus converted parallel video data are transmitted. In order to obtain a bit shift clock signal for determining the timing when such parallel video data are converted into the serial video data representing the image, a character clock signal is conventionally transmitted together with the parallel signals, for example, as disclosed in JP-A-61-233779. In this prior art, however, there has been a problem in that it is necessary to provide a PLL circuit for obtaining a bit shift clock signal from the character clock signal and therefore a display unit becomes complicated and expensive.

In the prior art disclosed in JP-A-61-105587, on the other hand, a plurality of shift registers are provided for converting parallel video data into serial video data. In this prior art, however, there has been a problem in that it is necessary to provide a selector for changing-over the outputs of the plurality of shift registers and to use a high-frequency bit shift clock signal for controlling the selector, so that the threshold frequency of a video signals is determined by the highest operating frequency of circuit elements other than the shift registers.

SUMMARY OF THE INVENTION

It is therefore a first object of the present invention to provide a parallel-to-serial signal converting apparatus for converting parallel bit signals of a low frequency into a serial bit signal of a given high frequency by using inexpensive and low speed circuit elements.

It is a second object of the present invention to provide a simple and inexpensive parallel-to-serial signal converting apparatus, when used with an image displaying system in which video data of a high frequency serial bit signal representing an image to be displayed on a display unit of the image displaying system is transmitted in the form of video data of low frequency parallel bit signals in order to suppress radiation noises which may occur during transmission, adapted to convert the low frequency parallel bit signals into the high frequency serial bit signal representing the image to be displayed.

The above first object is achieved, according to an aspect of the present invention, by a parallel-to-serial signal converting apparatus comprises: means for converting first parallel bit signals of a low frequency into second parallel bit signals having the same frequency as the first parallel bit signals and having information as to whether adjacent two bits of a desired serial bit signal to be finally obtained are equal in level or not; means for adjusting the phase of the second bit signals to form third parallel bit signals whose phases are successively delayed, in the sequence of the corresponding bits of the serial bit signal, by a phase difference substantially equal to the phase difference between adjacent two bits of the serial bit signal; and means for logically processing the third parallel bit signals to obtain the desired serial bit signal.

The above second object is achieved, according to another aspect of the present invention, by using a parallel-to-serial converting apparatus as above-mentioned in an image displaying system in which video data of a high frequency serial bit signal representing an image to be displayed on a display unit of the image displaying system is transmitted in the form of video data of low frequency parallel bit signals in order to suppress radiation noises which may occur during transmission, so as to convert the low frequency parallel bit signals into the serial bit signal representing the image to be displayed.

BRIEF DESCRIPTION OF THE DRAWINGS

FIG. 12($a$)–($e$) are wave form diagrams of a high frequency serial bit signal and low frequency parallel bit signals corresponding to the serial bit signal.

DESCRIPTION OF THE PREFERRED EMBODIMENTS

Figure 12A:
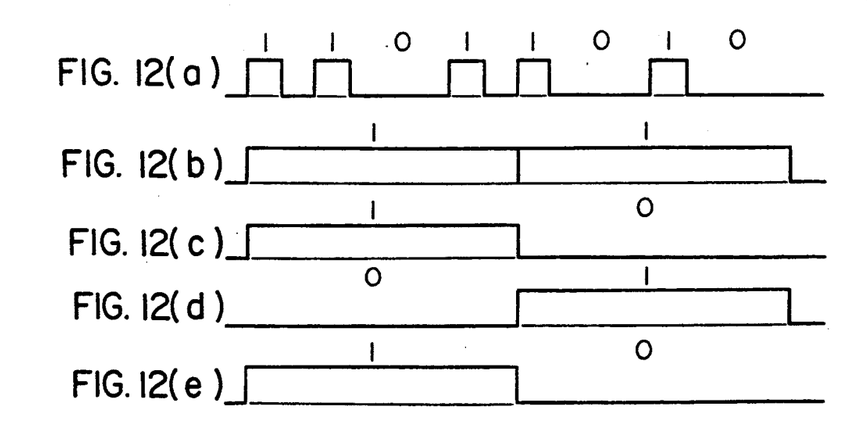

Description will be made as to embodiments in the case where the present invention is applied to an image displaying system. As shown in FIG. 12($a$), video data representing an image to be displayed on a display unit in the image displaying system is given in the form of a high frequency serial bit signal in which each bit is represented by a binary code of "1"or "0". When such video data is to be transmitted to the display unit, the video data is transmitted in the form of low frequency parallel bit signals as shown in FIGS. 12($b$) to 12($e$), in order to prevent troubles as radiation noises or the like due to high frequency waves from occurring. FIG. 12 shows a case where the video data of high frequency serial bit signal is transmitted in the form of low frequency parallel 4-bit signals. In this case, therefore, the frequency is reduced to one-fourth. Generally, the parallel bit signals are converted in two or three steps to parallel bit signals of different frequency. That is, the parallel n-bit signals of a low frequency reduced to 1/n are transmitted to a display means and converted by a conversion means provided in the display means into parallel m-bit signals (n>m>1), which are then converted to a desired serial bit signal of high frequency representing the original video data. However, the present invention is concerned with a circuit for converting the last-converted parallel m-bit signals into the desired serial bit signal of high frequency. Therefore, the embodiments of the present invention will be described merely as to the case where such a desired serial bit signal as shown in FIG. 12(a) is converted from parallel m-bit signals, for example, parallel 4-bit signals as shown in FIGS. 12(b) to 12(e).

Figure 2:
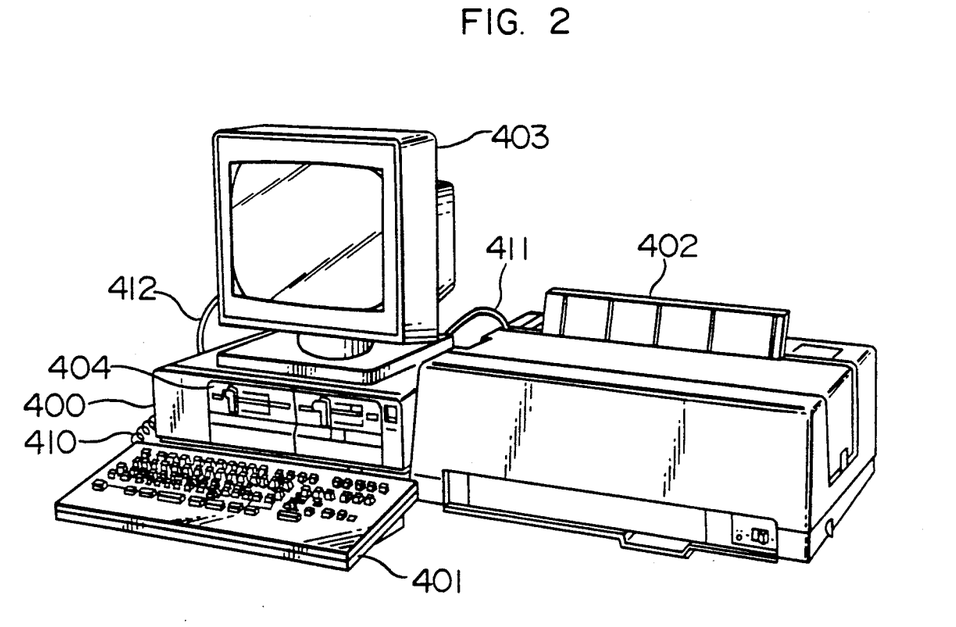
FIG. 2 is a perspective view showing the exterior of a document editing apparatus including the image displaying system of FIG. 1.

FIG. 2 shows a document editing apparatus using a displaying system provided with the parallel-to-serial signal converting apparatus according to the present invention.

The document editing apparatus is constituted by: a body 400 having a temporary storage portion and a control portion which will be described later; a keyboard 401 which is an input portion; a printer 402 which is a printing portion; and a display unit 403 which is a display portion. The body 400 is connected to the keyboard 401, the printer 402, and the display system 403 through signal lines 410, 411, and 412 respectively so as to perform delivery of control signals and information signals. The reference numeral 404 designates a flexible disk device (hereinafter, referred to as an "FDD").

Figure 3:
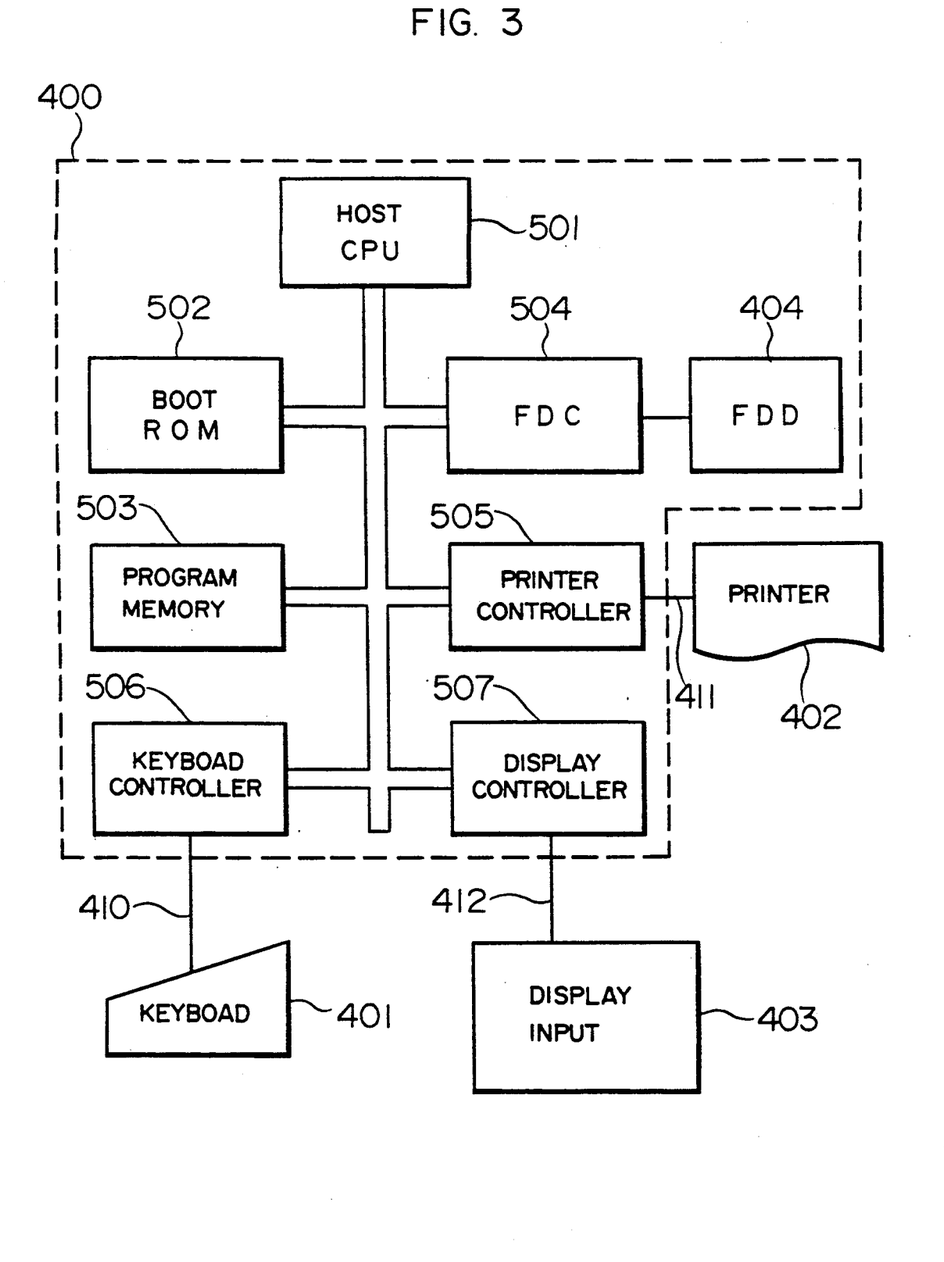
FIG. 3 is a circuit block diagram of the document editing apparatus of FIG. 2.

FIG. 3 is a block diagram showing the document editing apparatus. The body 400 is provided with a stored-program computer unit (hereinafter, referred to as a "host CPU") 501, a boot ROM 502 constituted by a nonvolatile memory and having a program to be executed upon turning-on of a power source, a program random access memory 503 for executing a function as the document editing apparatus, a flexible disk control portion (FDC) 504 for controlling the FDD 404 in accordance with the instructions from the host CPU 501, a printer controller 505 for controlling the printer 402 in accordance with the instructions from the host CPU 501, a keyboard controller 506 for controlling the keyboard 401 in accordance with the instructions of the host CPU 501 so as to transfer an input signal from the keyboard 401 to the host CPU 501, a display control portion 507 for producing a video signal and a displaying synchronizing signal in accordance with the instructions from the host CPU 501 and for supplying those signals to the display unit 403, and the display unit 403 for activating a CRT image area on he basis of the signals supplied from the display controller 507 so as to perform displaying.

Next, description will be made as to the whole operation of the document editing apparatus.

In the above configuration, upon turning the power source on, the host CPU 501 shifts a document editing program stored in a flexible disk in the FDD 404 into the program memory 503 in accordance with the program stored in the boot ROM 502, and then starts its operation on the basis of the document editing program. In accordance with the program, the host CPU 501 controls an input from the keyboard 401, saving or reading of a document into or out of the FDD 404, printing of a document in the printer 402, and the like, and controls the display control portion 507 to thereby send a video signal representing an image to be displayed and a synchronizing signal for controlling the display system 403, so that a document is displayed on the display unit 403. The document editing apparatus forms a document through such a series of operations.

Next, description will be made as to the display unit 403 and display controller 507 according to the present invention.

Figure 1:
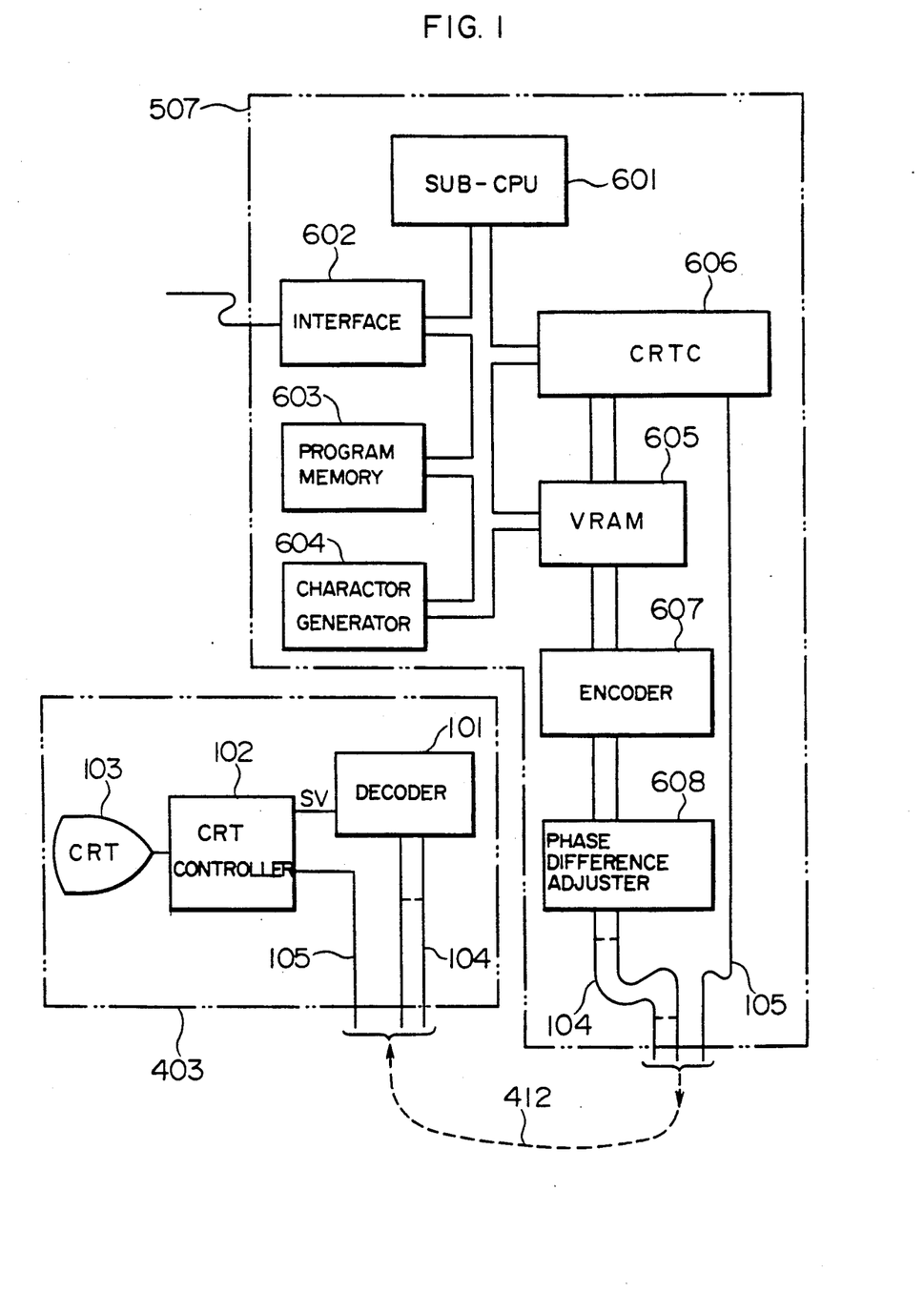
FIG. 1 is a block diagram showing an image displaying system using the parallel-to-serial signal converting apparatus according to the present invention.

FIG. 1 is a block diagram showing the display unit 403 and the display controller 507. The display controller 507 is constituted by a stored-program computer unit for displaying (hereinafter, referred to as a sub-CPU) 601, an interface (I/F) portion 602 for transferring instructions from an external device such as the host CPU 501 or the like to the sub-CPU 601, a program random access memory 603 having a display controlling program stored therein, a character generator 604 having a display character pattern stored therein, a video random access memory (VRAM) 605 for storing video data to be displayed, a CRT control circuit (CRTC) 606 for producing vertical and horizontal synchronizing signals to be transferred to the display unit 403 and for producing a signal representing video signal generation timing to be transferred to the VRAM 605 and an encoder 607 described later, the encoder 607 forming a feature of the present invention and for converting parallel image signals supplied from the VRAM 605 into parallel video signals having a phase difference therebetween on the basis of the control signal sent from the CRTC 606, and a delay adjuster 608 for adjusting a delay in the output of the encoder 607 so as to send a video signal top a CRT.

Next, description will be made as to the operation of the display controller 507.

The sub-CPU 601 is supplied with video data from the host CPU 501 through I/F portion 602 and writes the video data into the VRAM 605 on the basis of the displaying program stored in the program memory 603 or in accordance with the instructions sent from the host CPU 501 through the I/F portion 602. At this time, if the video data are concerned with figures of characters, the sub-CPU 601 reads character patterns from the character generator 604 and writes the character patterns into the VRAM 605.

The CRTC 606 generates the vertical and horizontal synchronizing signals to be supplied to the display unit 403 through a signal line 105 and a video-data read control signal to be supplied to the VRAM 605.

The video data written into the VRAM 605 are read on the basis of the reading control signal produced from the CRT 606, and the video data are transferred to the encoder 607. In the encoder 607, the parallel video data transferred from the VRAM 605 are encoded into a plurality of parallel video signals having a phase difference therebetween.

The encoded video signals are applied to the phase difference adjuster 608 so that delay time is provided to every signal to thereby adjust the phase difference between the respective signals.

The plurality of video signals put out in parallel to each other onto a plurality of signal lines 104 from the phase difference adjuster 608 are supplied to the display unit 403 together with the synchronizing signals generated from the CRTC 606 onto the signal line 105.

Next, description will be made as to the encoder 607 according to an embodiment of the present invention and an encoding method thereof. Although a case where video data are encoded into four parallel video signals will be described by way of example in the following explanation, the number of bits of the video signals is not limited to four but the present invention is applicable to any case, without losing the generality of the invention, where the number of bits of the video signals is selected to be any value other then four, so long as the video signals are arranged in parallel to each other.

Figure 4:
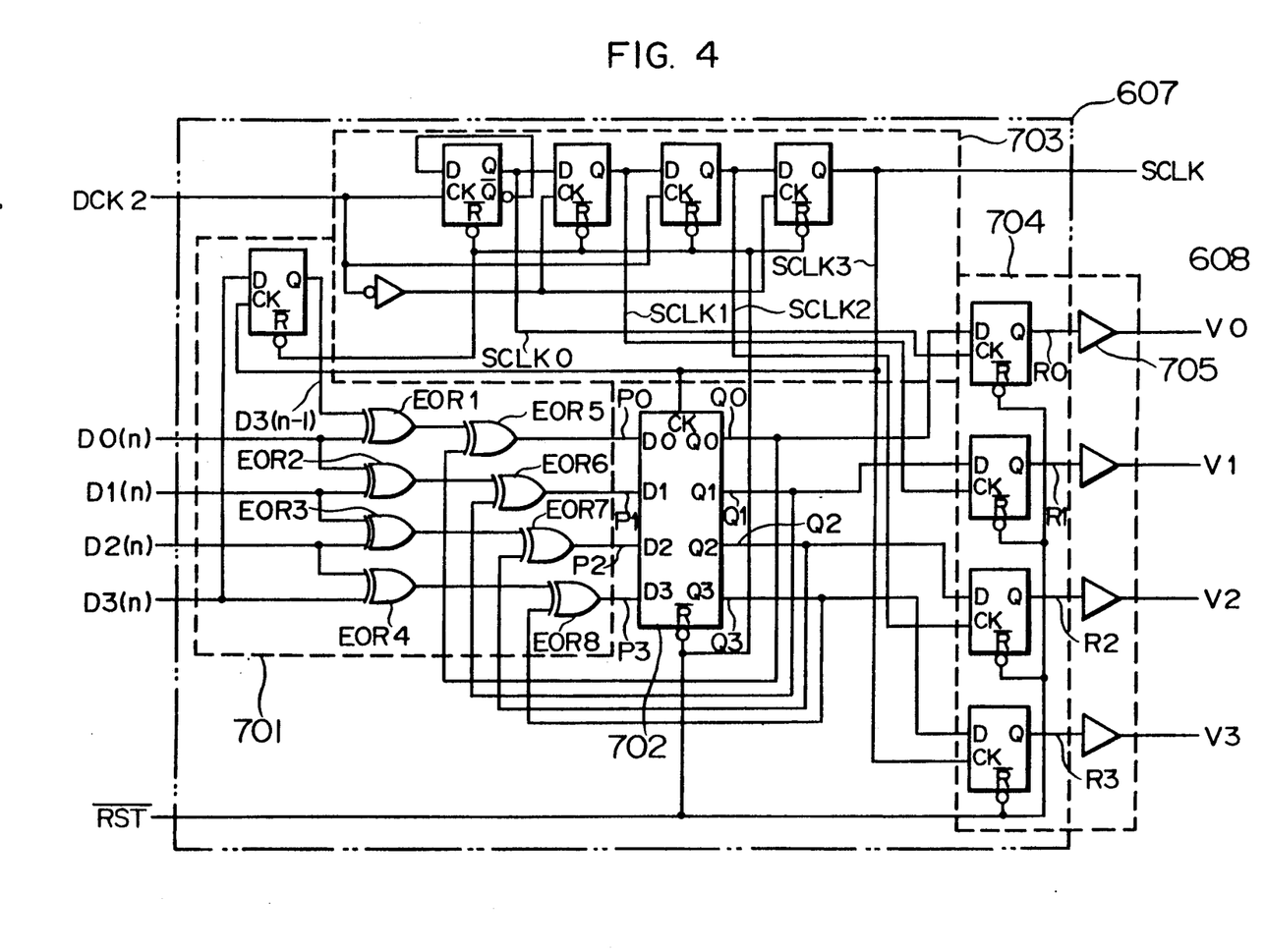
FIG. 4 is a circuit block diagram of the encoder and the phase difference adjuster.

FIG. 4 shows an embodiment of the encoder 607 and the phase difference adjuster 608. In this embodiment, video data read from the VRAM 605 in the form of 4-bit parallel signals are encoded into parallel video signals of 4 bits having a phase difference therebetween on the basis of shift clocks SCLK0 through SCLK3 which are formed from a DCK2 signal generated from a clock generator (not shown) built in the CRTC 606.

The encoder 607 is constituted by a parallel encoder 701, an in-phase latch 702, a clock generator 703 constituted by shift registers, and a phase difference latch 704. The phase difference adjuster 608 is constituted by delay circuits 705.

The bit clock signal DCK2 has a frequency which is a half of that of an ordinary bit shift clock signal. The clock generator 703 generates the bit shift clocks SCLK0 through SCLK3 having a phase difference therebetween by using the leading and trailing edges of the bit clock signal DCK2. A bit shift clock signal SCLK is formed by halving the frequency of the bit clock signal DCK2. The parallel data of 4 bits {D0(n), D1(n), D2(n), and D3(n)} from the VRAM 605 are supplied to the parallel encoder 701 in synchronism with the bit clock signal DCK2. In this case, the data are parallel data to be formed into a serial video signal {..... D2(n−1), D3(n−1), D0(n), D1(n), D2(n), D3(n), D0(n+1), D1(n+1), .....}.

In the parallel encoder 701, the four parallel bit signals D0(n), D1(n), D2(n), and D3(n) are converted into four encoded parallel signals P0(n), P1(n), P2(n), and P3(n) by a first set of four EORs (exclusive ORs) including EOR1, EOR2, EOR3 and EOR4, and a second set of four EORs including EOR5, EOR6, EOR7, and EOR8, the first set of four EORs being supplied with D0(n), D1(n), D2(n), D3(n) and D3(n−1), the second set of four EORs being supplied with the respective outputs of the EOR1 through EOR4 and the outputs Q0(n−1), Q1(n−1), Q2(n−1), and Q3(n−1) produced from the in-phase latch 702 one cycle before the shift clock signal SCLK. The four encoded parallel signals are converted by the in-phase latch 702 into four in-phase encoded parallel signals Q0(n), Q1(n), Q2(n), and Q3(n) each having a leading end synchronized with the bit shift clock signal SCLK3, and the four in-phase encoded parallel signals are transferred to the phase difference latch 704. In the phase difference latch 704, the four in-phase encoded parallel signals are latched with a phase difference one another which is corresponding to the minimum signal variation time, i.e. the time interval between adjacent two bits of the desired signal bit signal by using the bit shift clock signals SCLK0 to SCLK3 generated from the clock generator 703. Thus, four phase-shifted encoded parallel signals R0(n), R1(n), R2(n), and R3(n) having a phase difference one another are generated.

Thus, according to the present invention, the original four parallel bit signals are converted into four phase-shifted encoded parallel signals having a phase difference therebetween through a logical operation circuit constituted by two sets of four EORs. Accordingly, as will be understood from the parallel-to-serial converting operation of a decoder which will be described later, each of the respective leading ends of the four phase-shifted encoded signals Provides information as to whether or not the level of one bit of the desired serial bit signal corresponding to the associated encoded signal is equal to the level of the bit just preceding the above-mentioned one bit. In the case where the desired serial bit signal is converted from the phase-shifted encoded signals, it is possible to determine the level of each bit of the serial bit signal on the basis of the level condition of the leading end of each of the encoded parallel signals. It is one of the features of the present invention to convert parallel bit signals into phase-shifted encoded parallel signals.

Since the bit shift clocks SCLK0 through SCLK3 are generated at the leading and trailing edges of the bit clock signal DCK2, a phase displacement is caused by the duty factor of the bit clock signal DCK2 so that a displacement in phase difference is caused also in the encoded data {R0(n), R1(n), R2(n), and R3(n)} having a phase difference therebetween. The delay circuit 705 serves to adjust this phase displacement.

In the decoder in the display unit which will be described later, since a serial video signal is generated from the plurality of video signals on the basis of the mutual phase difference therebetween, there is a possibility that the dots to be displayed may become thin or thick by the above-mentioned phase displacement. It is therefore necessary to adjust the phase displacement.

Figure 5:
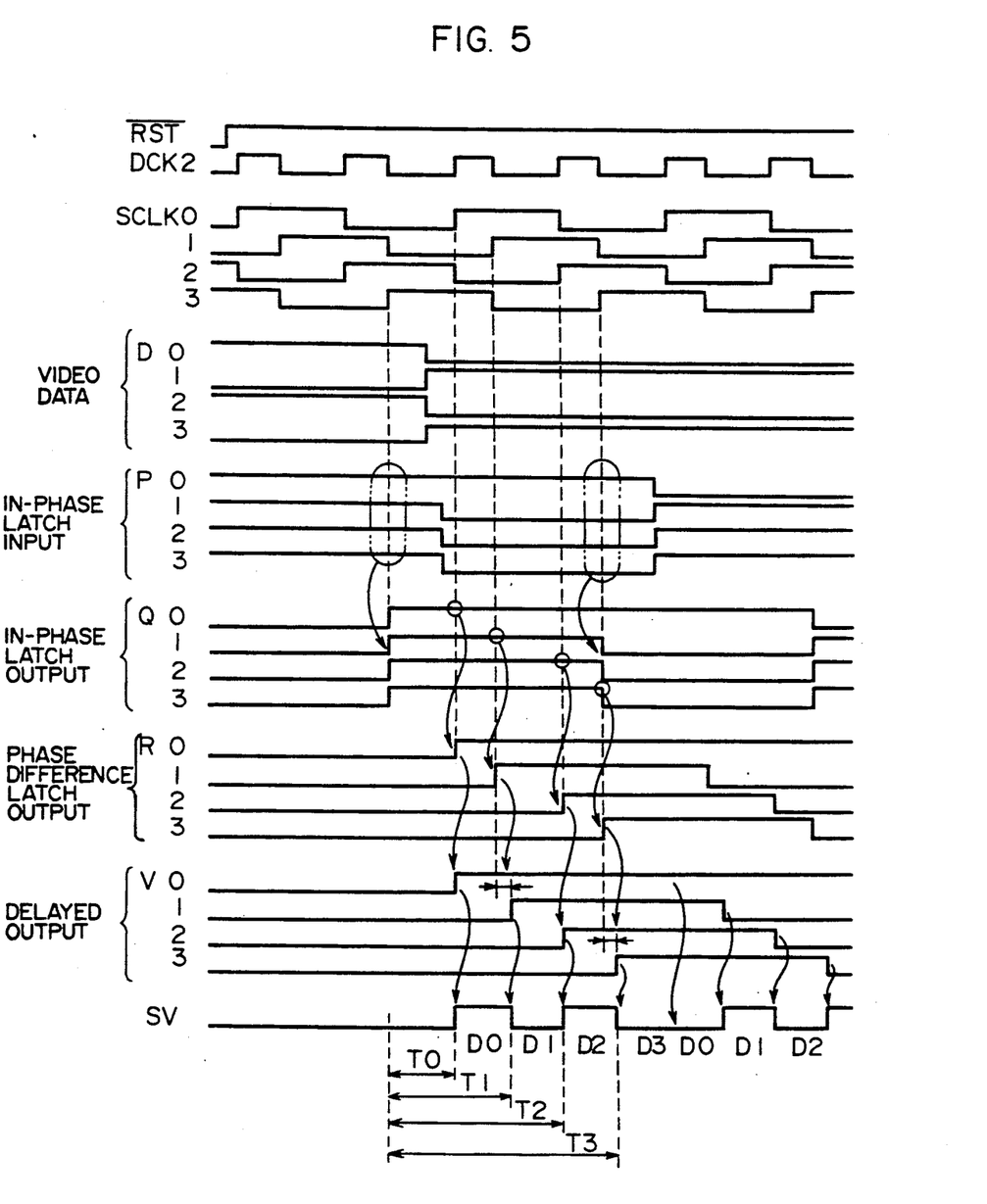
FIG. 5 is a time chart showing the operation of the encoder and the phase difference adjuster.

FIG. 5 shows a time chart for explaining the operation of the encoder 607 and the phase difference adjuster 608. A reset signal RST generated from the CRTC 606 is used for initializing flip-flop circuits in the encoder 607.

As shown in FIG. 5, delay time is inserted into the encoded data {R0(n), R1(n), R2(n), and R3(n)} in the phase difference adjuster 608 to thereby adjust the displacement in phase difference to thereby make it possible to reproduce or decode a serial video signal SV which is uniform in high level width and low level width by the decoder provided in the display unit 403.

In the encoder 607 shown in FIG. 4, since the highest operating frequency is a half of the frequency of an ordinary bit shift clock corresponding to the frequency of the desired serial bit signal. Further, the encoding process is effected during the parallel-to-parallel conversion of the parallel bit signals. Therefore, no conventional parallel-to-serial conversion circuit which has suffered from a limitation of the maximum operating frequency by the operational frequency of the logic elements constituting the conversion circuit is required to be used so that a high speed operation is easily realized by the conversion circuit of the invention.

Although the phase difference adjuster 608 is disposed in the succeeding stage of the encoder 607 in this embodiment, the phase difference adjuster 608 may be incorporated into the encoder 607.

Next, referring to FIGS. 6 and 7, another embodiment of the encoder 607 will be described.

Figure 6:
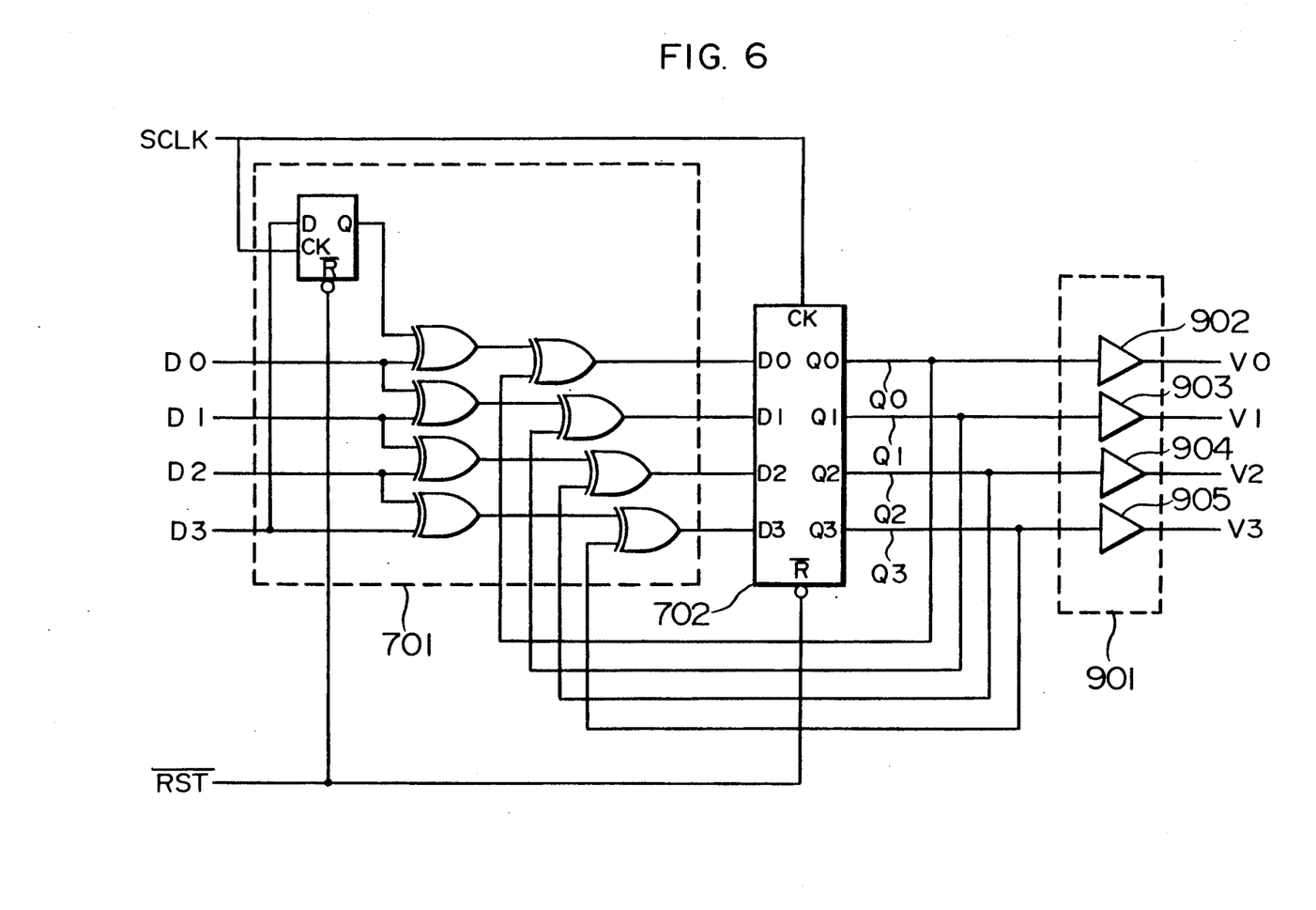
FIG. 6 is a block diagram showing another embodiment of the encoder.
Figure 7:
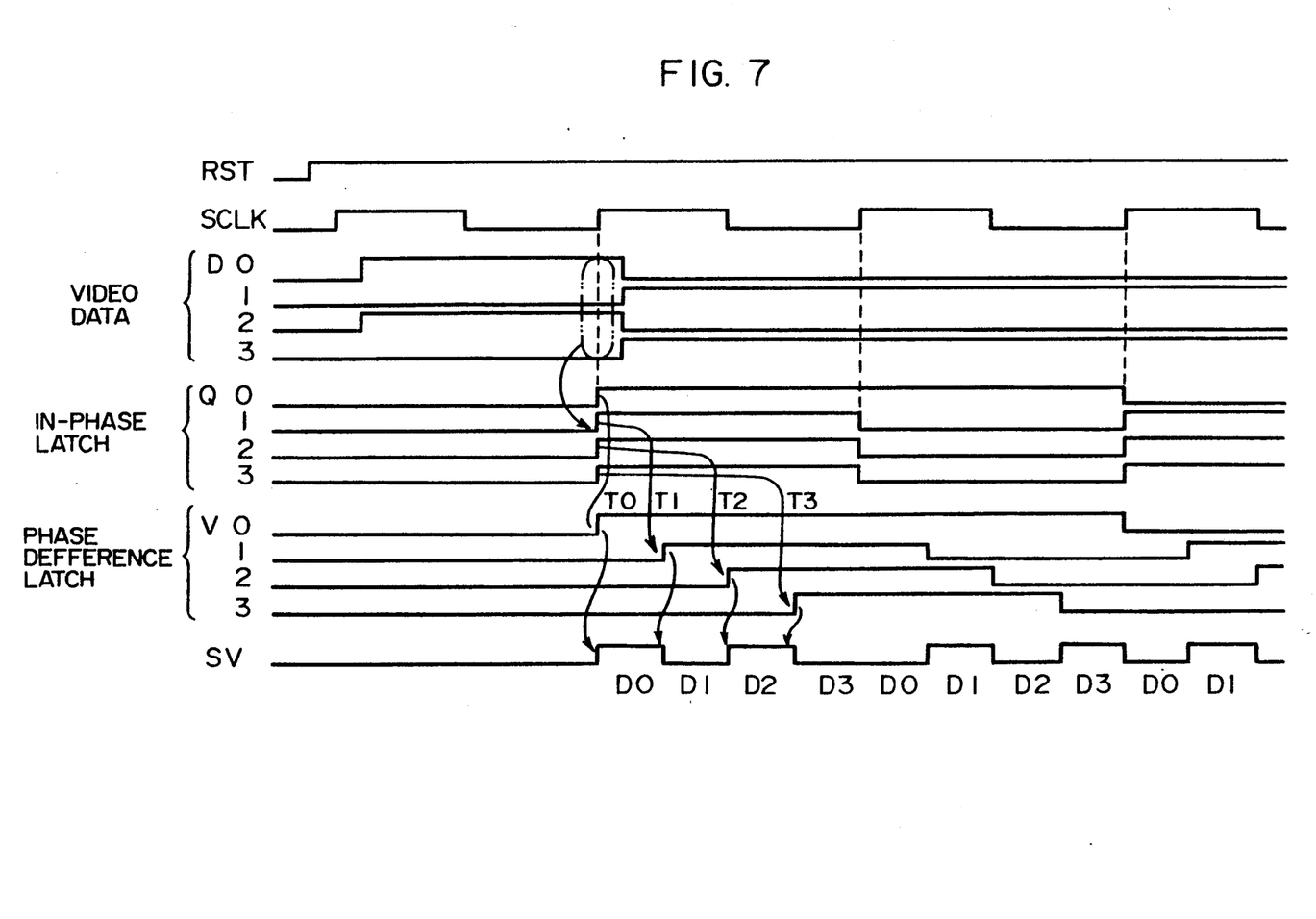
FIG. 7 is a time chart showing the operation of the encoder of FIG. 6.

In the encoder 607 shown in FIG. 6, not only the insertion of a phase difference but the phase difference adjustment performed by the phase difference adjuster 607 in the foregoing embodiment is performed by a phase difference inserting device 901 having a delay adjusting function.

The operation of this embodiment will be described by using the operational time chart of FIG. 7. The delay time is set so that the delay time T0 to be inserted into an in-phase latch output signal Q0, the delay time T1 to be inserted into an in-phase latch output signal Q1, the delay time T2 to be inserted into an in-phase latch output signal Q2, and the delay time T3 to be inserted into an in-phase latch output signal Q3 satisfy the following conditions.

$$T3-T2=T2-T1=T1-T0$$

$$T1+T3=1/SCLK$$

Since a phase difference is not provided by using the leading and trailing edges of a clock signal in this embodiment, unlike the embodiment of FIG. 4, only the SCLK signal of a low frequency is required. Further, the configuration of the encoder 607 is simple, and the operating frequency of the encoder 607 can be reduced to one-third or more.

Next, referring to FIG. 8, description will be made as to delay circuits 902, 903, 904, and 905 in the phase difference inserting device 901 with a delay adjusting function.

Figure 8:
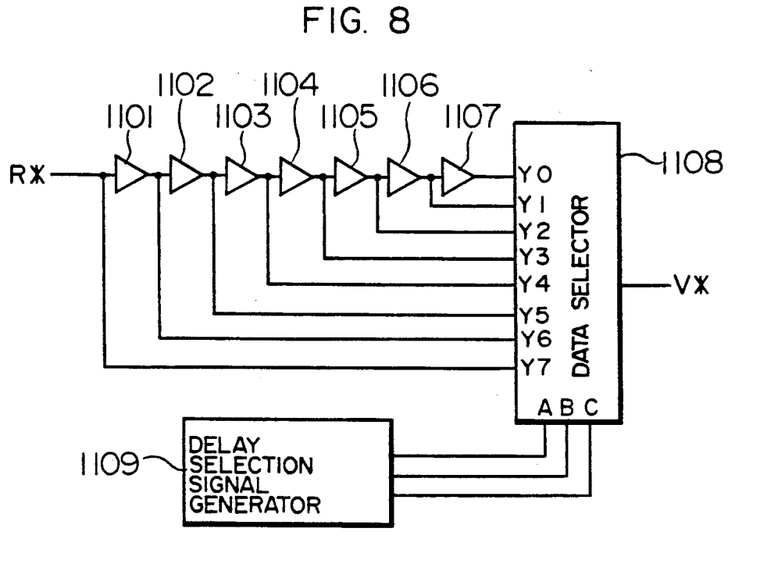
FIG. 8 is a block diagram showing the delay circuit.

FIG. 8 shows one delay circuit 902 (903 through 904). The delay circuit 902 is constituted by delay circuit elements 1101 through 1107, a data selector 1108, and a delay selection signal generator 1109, and configured so that the delay time to be inserted is set on the basis of the number of delay circuit elements through which an input signal R* is passed and a delayed output signal V* is obtained from the data selector 1108. A user may adjust the length of the delay time by operating the delay selection signal generator 1109 while watching an image area on the display unit.

The delay selection signal generator 1109 may be constituted by a switching unit such as a digital encoder or the like. Alternatively, if the delay elements or encoder elements have time aging, the delay selection signal generator 1109 may be constituted by registers which can be controlled by the sub-CPU 601 so that an operator of the document editing apparatus inputs a delay selection value through an input device such as the keyboard 401 or the like while visually confirming the thickening or thinning of dots on the image area of the display unit to thereby set the delay selection value into the registers through the host CPU 501 and the sub-CPU 601.

Next, returning to FIG. 1, the display unit 403 will be described.

In the display unit 403, a decoder 101 decodes the encoded parallel video signals transferred from the display controller 507 to thereby convert the parallel video signals into a serial video signals SV. A CRT control circuit 102 controls a CRT 103 to display a dot image on the basis of the serial video signals SV obtained from the decoder 101 and the vertical and horizontal synchronizing signals transmitted from the display controller 507 through the signal line 105.

Figure 9:
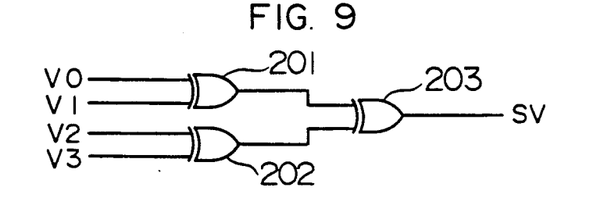
FIG. 9 is a block diagram showing the decoder.
Figure 10:
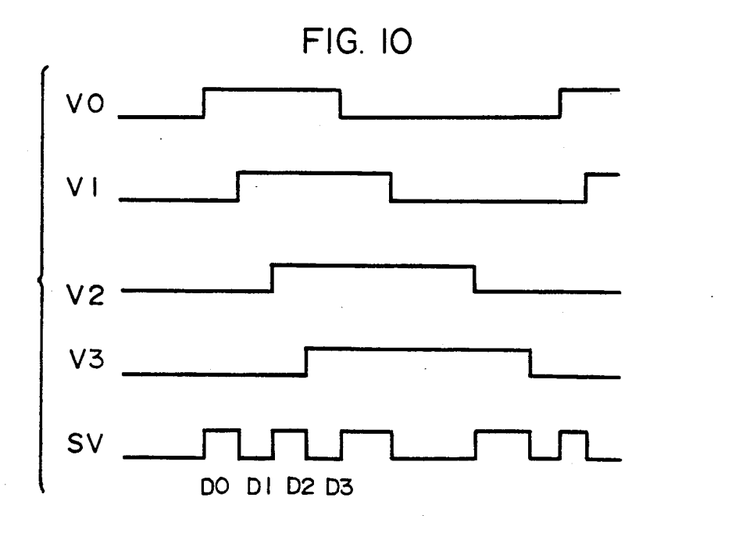
FIG. 10 is an operating time-chart of the decoder of FIG. 9.

FIG. 9 shows an embodiment of the decoder 101. The reference numerals 201, 202, and 203 designate exclusive "OR" circuit elements having input/output timing as shown in FIG. 10. The parallel video signals encoded in the encoder 607 are converted into the serial video signal SV in the decoder 101 as described above. As seen from the relationship in phase and level between the four encoded parallel signals V0, V1, V2, and V3 having a phase difference therebetween and the serial bit signal SV (D0, D1, D2, and D3) as shown in FIG. 10, for example, the leading end of the encoded signal V0 and the leading end of the bit signal D0 corresponding to the encoded signal V0 are in phase, and if the level is changed at the leading end of the encoded signal V0, the level of the bit signal D0 corresponding to the encoded signal V0 is changed from the level of the bit signal D3 immediately before the bit signal D0.

Figure 11:
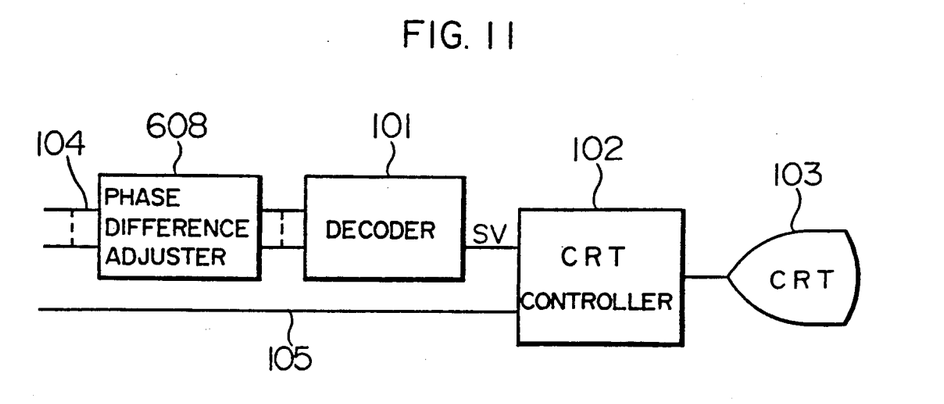
FIG. 11 is a circuit diagram of the display unit.

It is also effective to provide the phase difference adjuster 608 in the preceding stage of the decoder 101 in the display unit 403 as shown in FIG. 11 so as to finely adjust the phase difference in the display unit 403 side. In the case where the phase difference adjuster 608 for adjusting the display image area is provided in the display unit 403, an operator of the document editing apparatus can easily adjust the display image area (picture quality). Further, as the means for input of the delay adjustment selection value, it is possible to utilize an analog variable resistor and an analog-to-digital (A-D) converter.

If there occurs a displacement in phase difference between signals of parallel video data, thickening or thinning appears on the display dots to be reproduced. However, the encoded parallel signals are subject to time difference adjustment and no such a phenomenon of thickening or thinning is generated.

We claim:

1. A parallel-to-serial signal converting apparatus comprising:
   first means for converting first parallel bit signals of a low frequency to be converted to a high frequency serial bit signal into second parallel bit signals having the same frequency as said first parallel bit signals and having information as to whether adjacent two bits of said serial bit signal are equal in level or not;
   second means for adjusting phases of said second bit signals to form third parallel bit signals whose phases are shifted by a phase difference successively in an order of corresponding bits of said serial bit signal, said phase difference being substantially equal to the phase difference between adjacent two bits of said serial bit signal; an
   third means for logically processing said third parallel bit signals to obtain said serial bit signal.

2. A parallel-to-serial signal converting apparatus according to claim 1, in which said first means includes an EOR circuit for logically processing said first parallel bit signals.

3. A parallel-to-serial signal converting apparatus according to claim 1, in which the phase difference between adjacent two of said third parallel bit signals formed by said second means is adjusted based on a bit shift clock signal produced from a clock signal of a frequency lower than that of said serial bit signal.

4. A parallel-to-serial signal converting apparatus according to claim 1, in which said third means includes an EOR circuit for logically processing said third parallel bit signals.

5. A Parallel-to-serial converting apparatus according to claim 1, further comprising means for adjusting the phase difference of said third parallel bit signals.

6. A parallel-to-serial signal converting apparatus according to claim 5, in which said phase difference adjusting means includes a delay time adjusting circuit for receiving said second parallel bit signals and deriving them, as said third parallel bit signals, successively with time delay corresponding to the phase difference of said third parallel bit signals.

7. An image displaying system having a display unit for displaying an image based on first parallel bit signals of a low frequency corresponding to a serial bit signal of a high frequency representing said image to be displayed, said system comprising:

first means for converting said first parallel bit signals into second parallel bit signals having the same frequency as said first bit signals and having information as to whether adjacent two bits of said serial bit signal are equal in level or not;

second means for adjusting phases of said second parallel bit signals to form third parallel bit signals whose phases are shifted by a phase difference successively in an order of corresponding bits of said serial bit signal, said phase difference being substantially equal to the phase difference between adjacent two bits of said serial bit signal;

third means for logically processing said third parallel bit signals to reproduce said serial bit signal; and fourth means for applying said reproduced serial bit signal to said display unit.

8. An image displaying system according to claim 7, in which said first means includes an EOR circuit for logically processing said first parallel bit signals.

9. An image displaying system according to claim 7, in which the phase difference between adjacent two of said third parallel bit signals formed by said second means is adjusted based on a bit shift clock signal produced from a clock signal of a frequency lower than that of said serial bit signal.

10. An image displaying system according to claim 7, in which said third means includes an EOR circuit for logically processing said third parallel bit signals.

11. An image displaying system according to claim 7, further comprising means for adjusting the phase difference of said third parallel bit signals.

12. An image displaying system according to claim 11, in which said phase difference adjusting means includes a delay time adjusting circuit for receiving said second parallel bit signals and deriving them, as said third parallel bit signals, successively with time delay corresponding to the phase difference of said third parallel bit signals.

* * * * *